United States Patent [19]
Bashir

[11] Patent Number: 5,952,706
[45] Date of Patent: Sep. 14, 1999

[54] SEMICONDUCTOR INTEGRATED CIRCUIT HAVING A LATERAL BIPOLAR TRANSISTOR COMPATIBLE WITH DEEP SUB-MICRON CMOS PROCESSING

[75] Inventor: Rashid Bashir, Santa Clara, Calif.

[73] Assignee: National Semiconductor Corporation, Santa Clara, Calif.

[21] Appl. No.: 08/960,298

[22] Filed: Oct. 29, 1997

[51] Int. Cl.[6] .................. H01L 27/082; H01L 27/102; H01L 29/00
[52] U.S. Cl. .................. 257/587; 257/588; 257/559
[58] Field of Search ................... 257/587, 588, 257/592, 593, 910

[56] References Cited

U.S. PATENT DOCUMENTS

| | | | |
|---|---|---|---|
| 5,164,326 | 11/1992 | Foerstner et al. | 437/34 |
| 5,198,375 | 3/1993 | Hayden et al. | 437/31 |
| 5,262,345 | 11/1993 | Nasser et al. | 437/59 |
| 5,298,786 | 3/1994 | Shahidi et al. | 257/559 |
| 5,581,112 | 12/1996 | Li et al. | 257/557 |
| 5,610,087 | 3/1997 | Hsu et al. | 437/32 |

OTHER PUBLICATIONS

Yung Hao Lin et al., "Nitridation of the Stacked Poly–Si Gate to Suppress the Boron Penetration in pMOS," IEEE Transactions On Electron Devices, vol. 43, No. 7, Jul. 1996, pp. 1161–1165.

A. S. Ignat'ev et al., "Formation of layers of titanium nitride in low–energy inplantation of nitrogen ions in titanium," Sov. Tech. Phys. Lett. 18(5), May 1992, pp. 326–328.

J. Nulman et al, "Electrical and Structural Characteristics of the Nitrided Gate Oxides Prepared by the Rapid Thermal Nitridation," International Electron Devices Meeting, Dec. 9–12, 1984 (IEDM 84) pp. 169–172.

W. M. Huang et al., "TFSOI Complementary BiCMOS Technology for Low Power RF Mixed–Mode Applications," IEEE 1996 Custom Integrated Circuits Conference, pp. 35–38.

*Primary Examiner*—Wael M. Fahmy
*Attorney, Agent, or Firm*—Skjerven, Morrill, MacPherson, Franklin, & Friel, LLP; Edward C. Kwok; Glen B. Choi

[57] ABSTRACT

A semiconductor integrated circuit having a lateral bipolar transistor, is fabricated in a manner compatible with sub-micron CMOS processing. A base contact structure is formed over a bipolar active area, in essentially direct contact to a portion of the upper surface of the active region, essentially concurrent to the formation of a gate electrode on a gate dielectric layer in a CMOS active area. Sidewall spacers, adjacent the base contact region, are formed and a base region formed under the base contact structure using an oblique angle implantation. Emitter region and collector contact regions are formed concurrent with CMOS source and drain regions. An optional, oblique angle collector implant can be performed where desired.

16 Claims, 10 Drawing Sheets

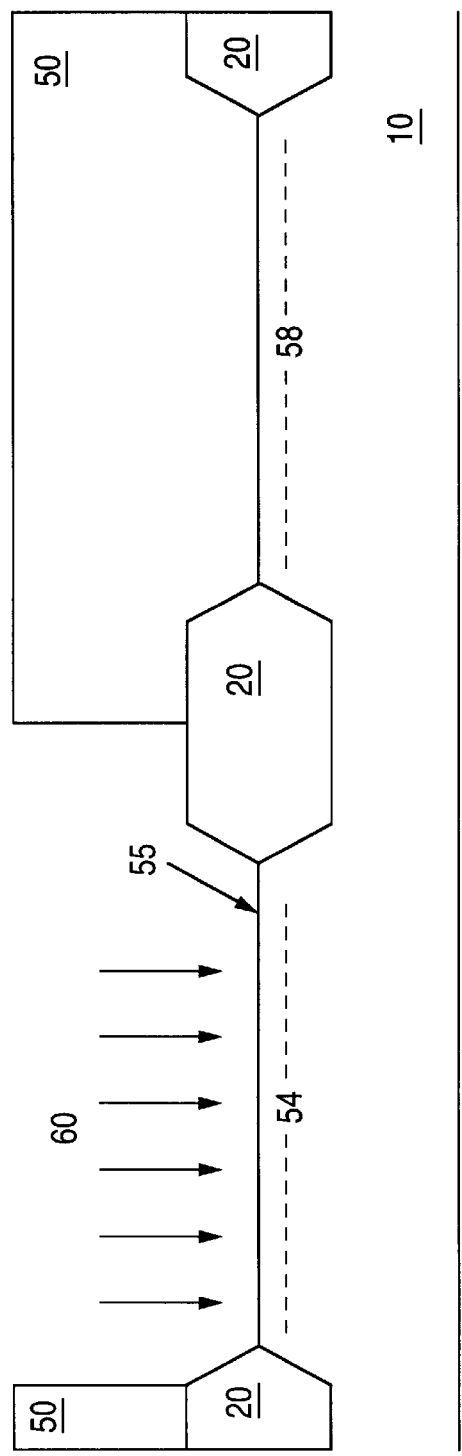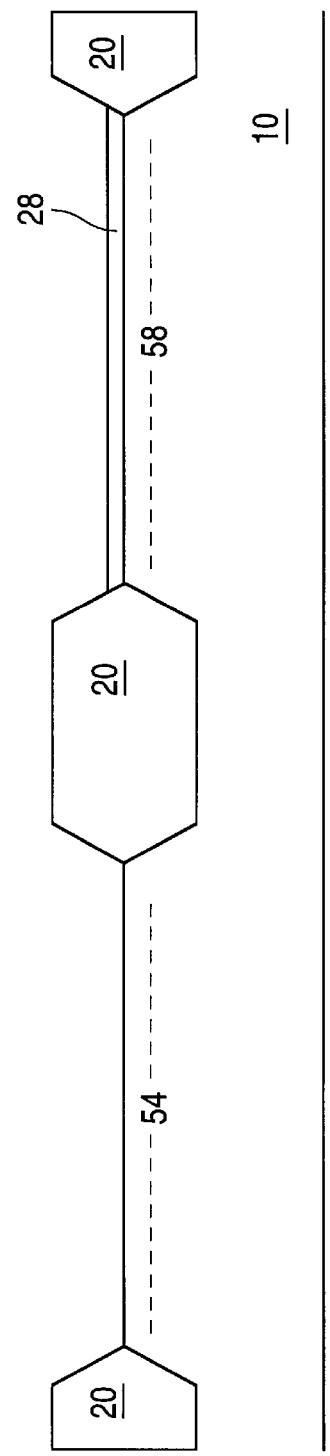
FIG. 2A
FIG. 2B

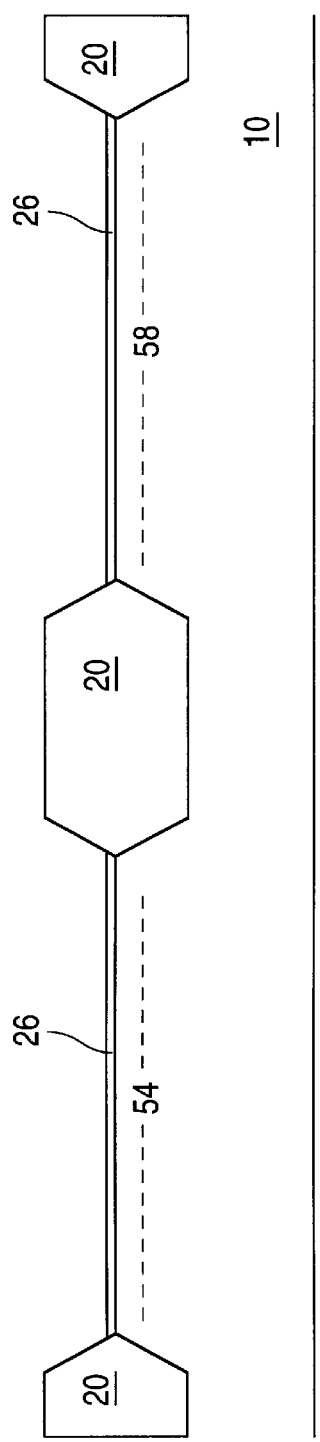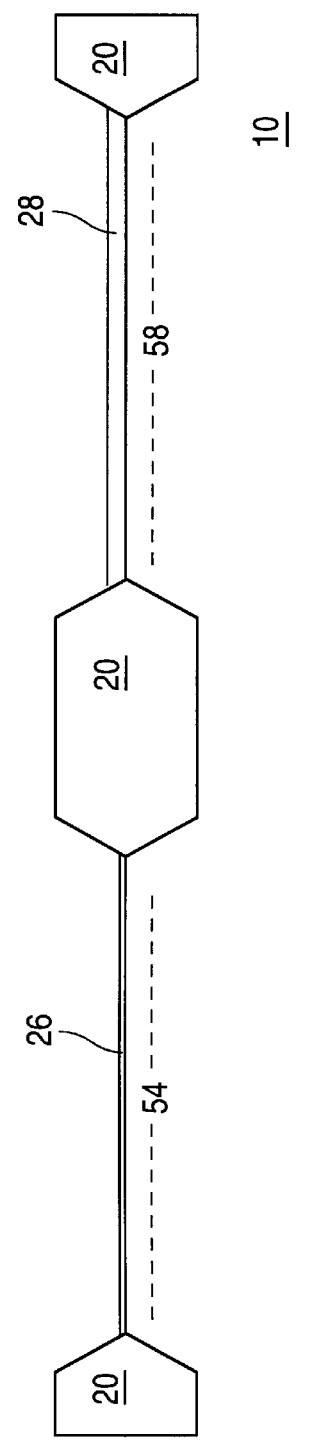
FIG. 3A
FIG. 3B

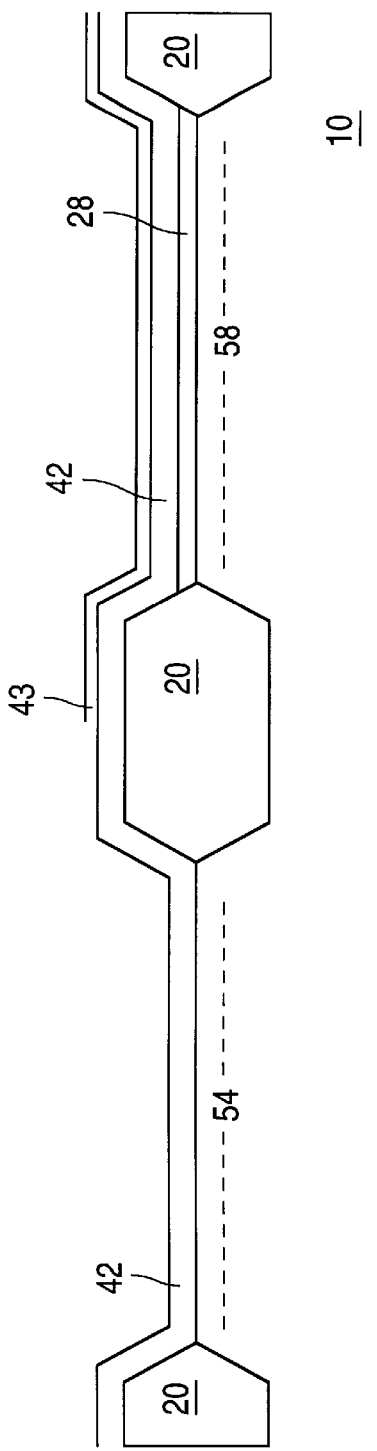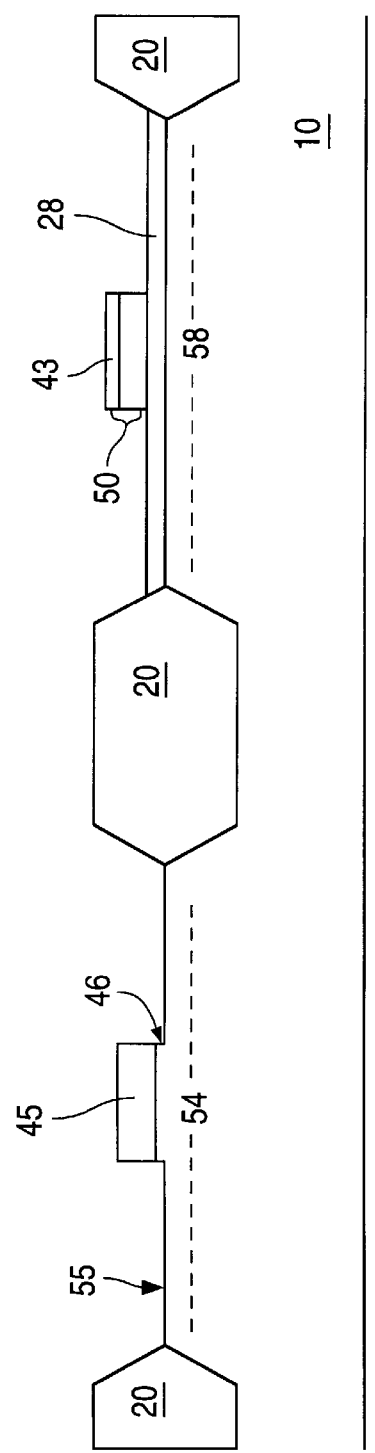
FIG. 4A
FIG. 4B

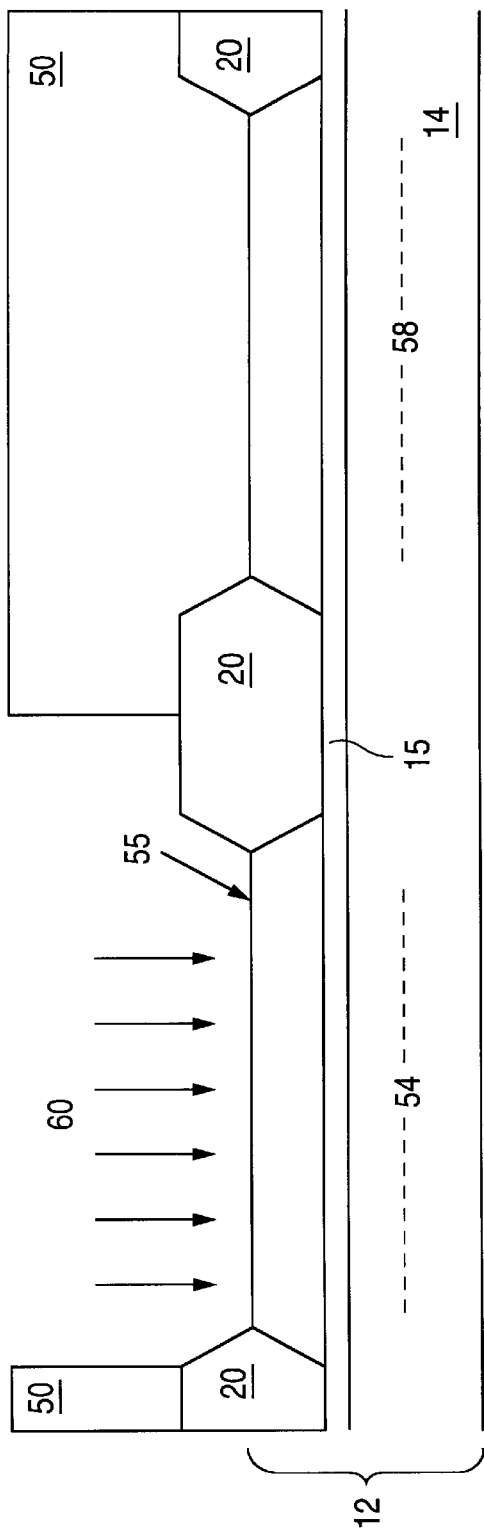
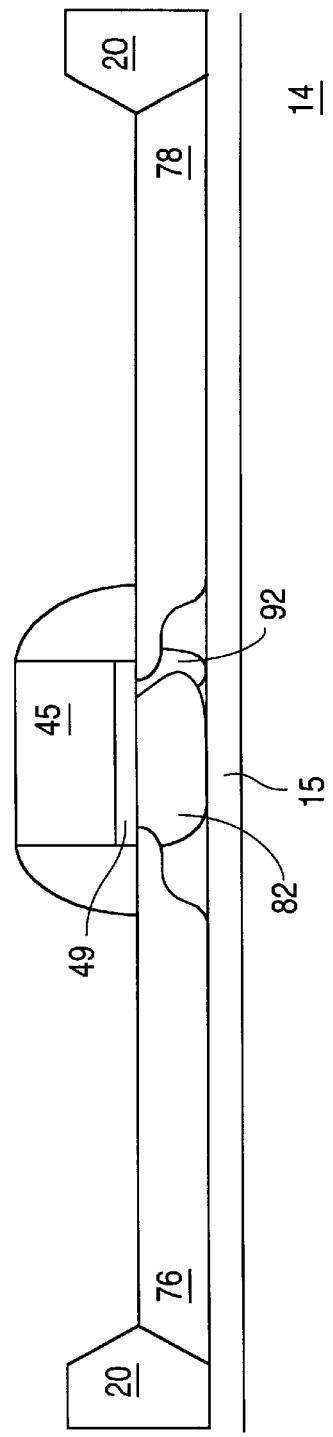
FIG. 5A
FIG. 5B

SEMICONDUCTOR INTEGRATED CIRCUIT HAVING A LATERAL BIPOLAR TRANSISTOR COMPATIBLE WITH DEEP SUB-MICRON CMOS PROCESSING

BACKGROUND

1. Field of the Invention

The present invention relates, in general, to semiconductor structures and methods for fabrication of those structures, and more specifically to a lateral bipolar transistor structure with low base resistance compatible with deep sub-micron (0.25 micron or less) CMOS transistor structures and methods for fabrication.

2. Related Art

The integration of CMOS (complementary metal oxide semiconductor) devices and bipolar devices to provide high performance BiCMOS (bipolar-CMOS) integrated circuits is a well-established technology. These integrated circuits (ICs) take advantage of the high current drive, high transconductance and high speed of bipolar transistors and the low DC power dissipation and high packing density of CMOS transistors to make advanced telecommunications and microprocessor applications possible. However, with the recent advances in semiconductor manufacturing technologies that are making it possible for deep sub-micron CMOS device geometry's (gate widths of 0.25 micron or less) to become manufacturable, the integration of a vertical bipolar transistor in such a CMOS process flow is typically difficult and costly. Thus, new solutions to the integration of bipolar and CMOS technologies need be found to take advantage of the scaling of these sub-micron CMOS devices without increasing process complexity beyond practicability.

One such solution is the substitution of lateral bipolar transistors for the commonly used vertical bipolar transistors. A lateral bipolar transistor differs in structure from that of a vertical transistor in a manner that makes such lateral transistors more easily integrated with CMOS processing.

This relatively easy integration into a CMOS process flow is evidenced by FIG. 1, which shows a cross-sectional view of a portion of a BiCMOS integrated circuit having a lateral NPN transistor 4 formed in the manner of the prior art. It will be understood that while an NPN transistor is described, this is for illustrative purposes only, and that transistor 4 can be a PNP transistor. A P-type semiconductor substrate 10 has a bipolar device region 30 defined by isolation regions 22. A P-type buried layer region 14 is seen to be coupled to a P-type base region 18. Extending from base region 18, buried layer region 14 underlies N-type collector and emitter regions 32 and 36, respectively. Collector and emitter contact regions 46 and 44, respectively, are separated by poly structure 40 overlying dielectric layer 24, and spacers 28 adjacent each sidewall of structure 40, thus defining the width of the active base region 16. Base contact region 48 is separated from collector contact region 46 by isolation region 26. Thus one of ordinary skill in the art can see that poly structure 40, dielectric layer 24 and spacers 28 can be formed concurrent with a CMOS gate structure (not shown); and that collector region 32 and emitter region 36 can be formed simultaneously with CMOS source and drain (S/D) structures (not shown).

However, such conventional lateral bipolar transistors typically suffer from poor performance, as compared to their vertical transistor counterparts. In addition, these conventional lateral transistors can consume a disproportionate amount of surface area. Thus, this combination of performance and space, limit the use of such conventional lateral transistors. For example, $F_T$ and $F_{MAX}$, for a typical vertical transistor, can each be as high as 30 GigaHertz (GHz), while for lateral transistor 4, $F_T$ and $F_{MAX}$ are in the range of 5 MegaHertz (MHz) to 50 MHz. The low $F_{MAX}$ is due, in major part, to high base resistance $R_b$, approximately 1 to 10 kilo-ohms (kΩ) for the prior art devices, (the sum of $R_1$, $R_2$ and $R_3$ as depicted in FIG. 1). While $F_T$ is low due to the large base width, as defined by the length of the poly gate structure. With regard to the surface area consumed, as depicted, transistor 20 requires an area in excess of that of a MOS transistor, having additional area for base region 18 and base contact 48, and isolation region 26.

Thus, it would be advantageous to have a lateral bipolar transistor and method which has increased performance. In addition, it would be advantageous if this lateral bipolar transistor has increased packing density over conventional lateral transistors. It would also be advantageous for this lateral transistor and method could be applicable to either bulk semiconductor substrates or silicon on insulator (SOI) type substrates. Finally, it would be advantageous for this lateral bipolar transistor and method to be easily integrated into deep sub-micron CMOS processing without significantly increasing process complexity or manufacturing costs.

SUMMARY

In accordance with embodiments of the present invention, lateral bipolar transistor structures are enabled that overcome or reduce the above mentioned problems and provide the above mentioned advantages. In addition, methods for forming these transistors are enabled herein.

According to some embodiments of the present invention, a lateral bipolar transistor is formed in a semiconductor substrate having a bipolar device region defined by an isolation region. A first conductive layer is deposited and patterned to form a base contact structure in essentially direct contact with a portion of an upper surface of the bipolar device region. In some embodiments, lightly doped regions are formed, self-aligned to the base contact structure and isolation regions. A base region is formed under a portion of the base contact structure, aligned to a first edge or sidewall of the contact structure. A collector region formed, in some embodiments using an optional implant step, aligned to a second edge of the contact structure, opposite the first edge, and adjacent the base region under another portion of the base contact structure. Dielectric spacers are formed adjacent both edges or sidewalls of the contact structure and a collector contact region and an emitter contact region are formed aligned to the spacers and proximate the first and second edges of the base contact structure, respectively. Where lightly doped regions were previously formed, the emitter and collector regions overlie portions of such regions. As embodiments of the present invention can be PNP or NPN transistors, the conductivity type of the various doped regions are selected for the type of transistor desired.

In some embodiments of the present invention, the semiconductor substrate is a bulk silicon substrate. In some embodiments the bulk silicon substrate has an epitaxial layer or doped well structures formed thereon, as are known. In other embodiments the semiconductor substrate is an SOI substrate.

In some embodiments of the present invention, the lateral bipolar transistors formed are portions of a BiCMOS integrated circuit (IC). While in other embodiments of the present invention, the transistors formed are portions of a bipolar integrated circuit. Where transistors in accordance with the present invention are formed as portions of a BiCMOS IC, some embodiments eliminate or reduce oxidation of the surface of the bipolar device region. In other embodiments, any oxidation of the surface of the bipolar device region is removed.

BRIEF DESCRIPTION OF THE DRAWINGS

The present invention may be better understood, and its numerous objects, features, and advantages made apparent to those skilled in the art by referencing the accompanying drawings. For ease of understanding and simplicity, where elements are common between illustrations, common numbering of those elements is employed between illustrations.

FIGS. 2A and 2B are cross-sectional views of early steps in the fabrication of a sub-micron lateral NPN transistor in accordance with an embodiment of the present invention;

FIGS. 3A and 3B are cross-sectional views of early steps in the fabrication of a sub-micron lateral NPN transistor in accordance with another embodiment of the present invention;

FIGS. 4A–4H are cross-sectional views of subsequent steps in the fabrication of a sub-micron lateral NPN transistor in accordance with an embodiment of the present invention that are consistent with either embodiment of early steps above;

FIGS. 5A and 5B are cross-sectional views of steps in the fabrication of a sub-micron lateral NPN transistor in accordance with another embodiment of the present invention;

DETAILED DESCRIPTION

Figure 1:
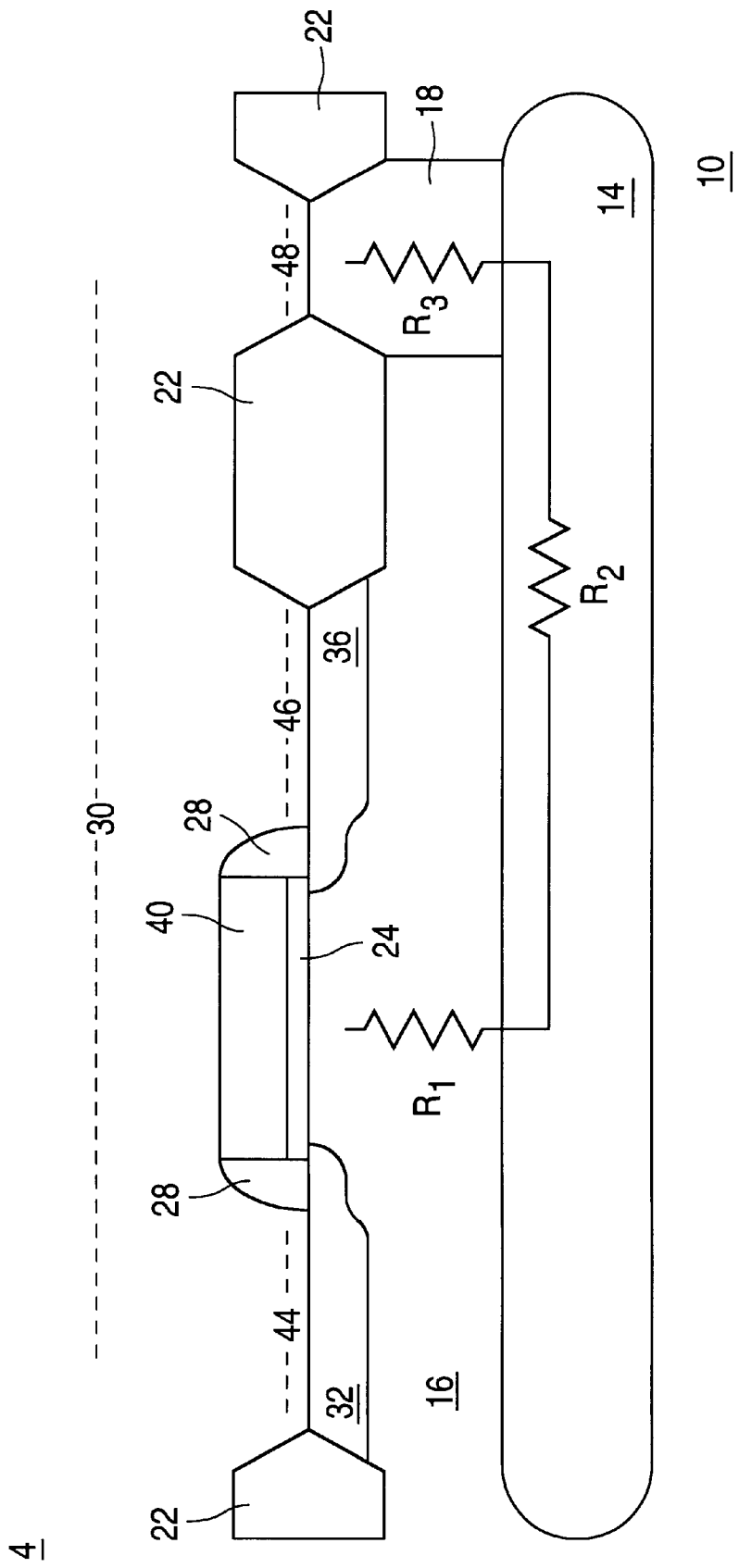
FIG. 1 is a cross-section view of a portion of a BiCMOS integrated circuit illustrating a lateral NPN transistor formed in the manner of the prior art.

As embodiments of the present invention are described with reference to the aforementioned drawings, various modifications or adaptations of the specific methods and or structures may become apparent to those skilled in the art. All such modifications, adaptations or variations that rely upon the teachings of the present invention, and through which these teachings have advanced the art, are considered to be within the scope of the present invention.

Turning to FIG. 2A, a cross-sectional view of a sub-micron lateral NPN transistor is shown at an early fabrication step in accordance with an embodiment of the present invention. Semiconductor substrate or wafer 10 is seen to have isolation regions 20 previously formed to define a bipolar device region 54 and a MOS device region 58. While FIG. 2A depicts isolation regions 20 as LOCOS or LOCalized Oxidation of Silicon isolation regions 20 and wafer 10 as a bulk substrate having a minimum of complexity, it will be understood that other appropriate methods of isolation or other semiconductor substrates can be also employed. For example, regions 20 can be formed as shallow trench isolation regions 20 and substrate 10 can encompass N-type and/or P-type well regions (not shown) and/or an epitaxial layer (not shown), or any other appropriate type of semi-conductor substrate as will be discussed hereinafter.

As depicted, a photoresist layer 50, is deposited and patterned overlying wafer 10 to expose an upper surface 55 of bipolar device region 54 and portions of adjacent isolation regions 20. In some embodiments of the present invention, exposed surface 55 is nitridized to form a thin oxidation resistant region (not shown) adjacent surface 55. As depicted in FIG. 2A, the nitridization is accomplished by treating surface 55 with either a low energy nitrogen ($N_2$) plasma or $N_2$ implantation 60. Where a $N_2$ implantation is used for nitridization, it has been found that implanting surface 55 with a dose of between approximately $1 \times 10^{13}$ to $1 \times 10^{15}$ ions per cubic centimeter (ions/$cm^3$) with an energy of between approximately 5 to 20 thousand electron volts (KeV) advantageously forms a nitridized surface 55. And where a $N_2$ plasma is selected for nitridization, it has been found that treating surface 55 with a $N_2$ glow discharge at a pressure of between approximately 400 to 1000 milliTorr (mT) and 100 to 500 watts of Radio frequency (Rf) energy advantageously forms a nitridized surface 55. This thin nitridized region formed adjacent surface 55 is essentially comprised of silicon nitride or a silicon nitride like material and serves to advantageously inhibit subsequent oxidation of that surface, as is known for silicon nitride layers formed by commonly employed methods.

FIG. 2B shows the structure of FIG. 2A at a subsequent fabrication step. Masking layer 50 (FIG. 2A) has been removed and gate oxide layer 28 formed. Gate dielectric layer 28 is typically a silicon oxide material having a thickness in the range of approximately 3 to 6 nm, although other appropriate materials and/or thicknesses can be used. For example, a nitridized silicon oxide material can be employed. Where gate dielectric layer 28 is silicon oxide, it is formed using standard thermal oxidation processing. For example, heating substrate 10 in a dry oxygen atmosphere to between approximately 850 to 900 degrees Centigrade (°C.) for a time sufficient to grow an oxide having a thickness within the previously specified range. However, due to the nitridization process and formation of the thin region (not shown) adjacent surface 55 of region 54, as mentioned above, gate dielectric layer 28 is blocked from forming in region 54. Thus, formation of gate dielectric layer 28 by oxidation is limited to those surfaces that were protected from oxidation by the prior nitridization process, e.g. region 58.

Referring to FIGS. 3A and 3B, another embodiment of the present invention is depicted showing an alternative method for the selective nitridization of surface 55. As discussed previously with respect to FIG. 2A, FIG. 3A depicts substrate 10 having isolation regions 20 defining both bipolar device region 54 and MOS device region 58. As before, other appropriate methods of isolation or other appropriate semiconductor substrates can be employed for regions 20 and substrate 10, respectively. A thin masking layer 26, is shown overlying both bipolar region 54 and MOS region 58. Masking layer 26 is a silicon nitride or silicon oxynitride material or some combination thereof as is known to be formed through the reaction of $NH_3$ and/or $N_2O$ with silicon surface 55. Preferably, masking layer 26 is formed as a very thin layer, on the order of 1 to 4 nm, although other appropriate thickness can be employed.

In FIG. 3B, the structure of FIG. 3A is shown after that portion of masking layer 26 overlying MOS region 58 has been removed. Layer 26 is removed from region 58 by depositing and patterning a photoresist layer (not shown) on substrate 10, such that layer 26 is exposed overlying region 58. The exposed portion of layer 26 (not shown) is removed using an appropriate etching process for the specific material of layer 26. For example, where layer 26 is silicon nitride, a wet etch using phosphoric acid can be employed. Once layer 26 is removed from MOS region 58, the photoresist layer is removed and gate dielectric layer 28 formed. As discussed with respect to FIG. 2B, gate dielectric layer 28 is typically a silicon oxide, or other appropriate material having a thickness between approximately 3 and 6 nm, and is formed using an appropriate oxidation process. Masking layer 26, then advantageously blocks the oxidation of surface 55 within region 54 and gate dielectric layer 28 is formed only in regions where masking layer 26 has been removed, such as region 58. In some embodiments, after oxidation, masking layer 26 is substantially removed by etching with phosphoric acid, as is known.

Turning now to FIG. 4A, the structure of either FIG. 2B or 3B is shown after optional threshold adjust implants (not shown) have been performed, if desired. As known, the dopant concentrations of MOS channel regions to be formed, are often adjusted with threshold adjust implants prior to forming gate structures. As known, where different threshold voltage adjust implants are performed for N-type MOS channel regions from those of P-type MOS channel regions, the threshold voltage adjust implants can be performed using an implant mask. Thus, where such threshold voltage adjust implants are not wanted within bipolar region 54, an implant mask (not shown) is formed overlying region 54 and the subsequently removed. A conductive layer 42 is seen overlying regions 54 and 58, and is typically a polysilicon material having a thickness of between approximately 200 to 400 nm, although amorphous silicon or a combination of amorphous silicon and poly silicon can be used to form layer 42. Conductive layer 42 is typically deposited as an un-doped layer. Where an NPN transistor is to be formed within region 54, layer 42 is implanted with boron (B) ions using a dose of approximately $5 \times 10^{15}$ to $1 \times 10^{16}$ ions/cm$^3$ at an energy of approximately 10 to 30 KeV. Where a PNP transistor is desired, layer 42 is implanted, for example, with arsenic (As) ions using a dose of approximately $5 \times 10^{15}$ to $1 \times 10^{16}$ ions/cm$^3$ at an energy of approximately 50 to 100 KeV. After layer 42 is doped an optional masking layer 43 of silicon oxide or silicon nitride, having a thickness of between approximately 100 to 200 nm can be formed. Where the optional masking layer 43 is employed, it is patterned, using well known photolithographic and etch processes, concurrently with layer 42 and serves to mask layer 42 from further implantation. Optional masking layer 43 is depicted overlying only a portion of layer 42 for illustrative purposes only.

FIG. 4B depicts the structure of FIG. 4A after conductive layer 42 has been patterned. Layer 42 is patterned using well-known photolithography and etch techniques to form a gate structure 50, depicted having optional masking layer 43 disposed thereon, overlying a portion of MOS region 58 and a base contact structure 45 without optional masking layer 43, overlying a portion of bipolar region 54. It should be realized that optional masking layer 43, is shown for illustrative purposes only, and when employed is typically used for both structures 45 and 50. As known, the reactive ion etch (RIE) or other plasma etch techniques used to form structures 45 and 50, typically rely on the presence of an oxide layer, for example gate dielectric layer 28, for the prevention of etching substrate 10, where exposed. However, as formation of layer 28 within region 54 has been specifically prevented, some etching of substrate 10 can occur at surface 55, and a recess 46, aligned to contact structure 45, formed. Advantageously, etch techniques used to form structure 45 also removes substantially all of masking layer 26 (FIG. 3B) or the thin oxidation resistant layer described with respect to FIG. 2B, that might be present overlying region 54 in some embodiments. Thus, embodiments of the present invention provide for the formation of gate structure 50 and contact structure 45, concurrently.

Figure 4C:
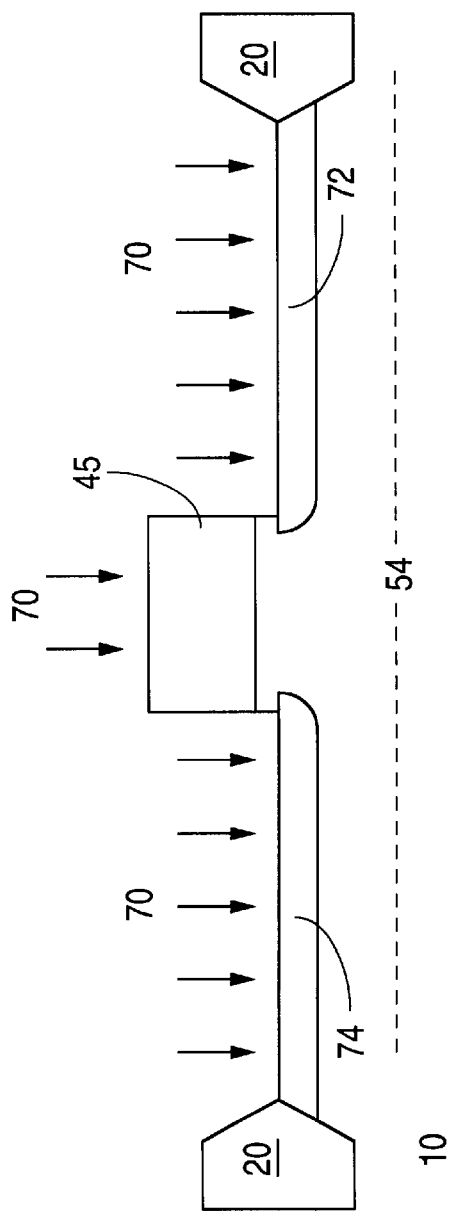

Referring now to FIG. 4C, only the bipolar portion of the structure of FIG. 4B is shown for simplicity and ease of understanding. Doped regions 72 and 74 are formed within bipolar region 58 by ion implant 70 to have a dopant concentration of between approximately $8 \times 10^{17}$ and $8 \times 10^{18}$ ions/cm$^3$. The specific dopant type employed by implant 70 will depend upon whether the lateral transistor being formed is an NPN or PNP transistor. Where an NPN transistor is desired, implant 70 is an N-type dopant, such as arsenic, and where a PNP transistor is desired, a P-type dopant such as boron is employed. It will be understood, that implant 70 can also be employed to form LDD (lightly doped drain) regions (not shown) within MOS region 58 (FIG. 4B). Thus, where implant 70 employs an N-type dopant, N-type regions 72 and 74 are formed concurrently with N-type MOS LDD source and drain regions (not shown). Where implant 70 is P-type, P-type regions 72 and 74 are formed concurrently with P-type MOS LDD regions (not shown). In embodiments, where no LDD regions are formed in MOS region 58, doped regions 72 and 74 are typically omitted.

Figure 4D:
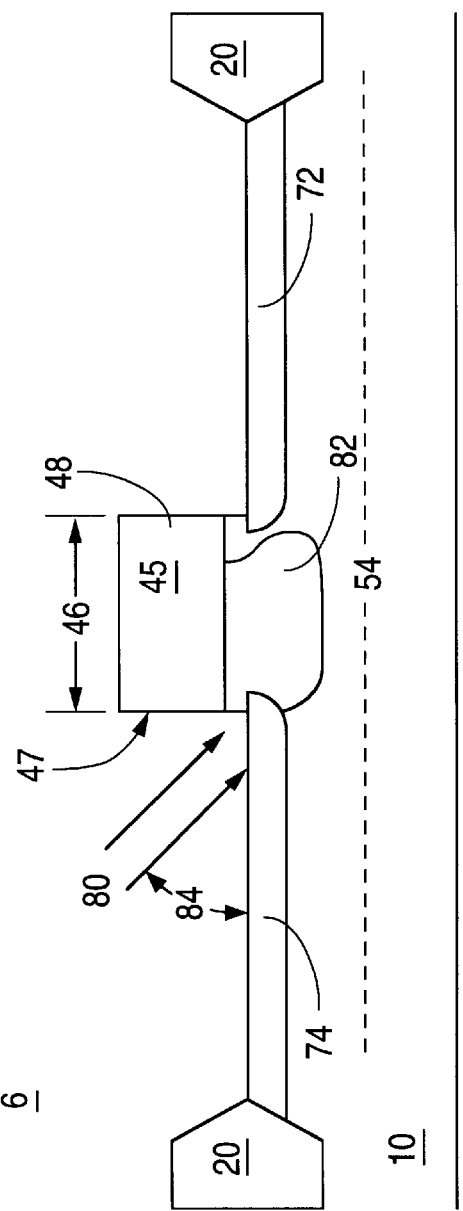

FIG. 4D shows the formation of a base region 82 positioned below base contact structure 45. Base region 82 is formed by base implant 80 performed at an oblique angle 84, between approximately 45 to 75 degrees to substrate 10. A masking layer (not shown) is employed to block implantation of MOS regions (not shown). It is important to note that in addition to the oblique angle 84, in some embodiments, implant 80 is performed without rotation of substrate 10 and that all base structures 45 are positioned on substrate 10 having the same orientation. In this manner, implant 80 can advantageously position each base region 82 under structure 45, aligned to a specific edge 47. In other embodiments of the present invention, implant 80 is performed with rotation of substrate 10 and region 82 is positioned uniformly underlying structure 45.

The specific amount of energy needed for implant 80 depends, among other things, on width 46 of base structure 45. Thus, where no rotation of substrate 10 is employed to position base region 82 under a portion of structure 45, adjacent edge 47 but only proximate to opposing edge 48, as depicted, the energy of implant 80 is adjusted as a function of the actual implant angle 84 and width 46. For example, where angle 84 is 35 degrees and width 46 is 0.18 micron ($\mu$m), an energy of approximately 50 KeV is appropriate for implant 80. In addition, implant 80 can create either a P-type base region 82, when forming an NPN transistor 6, or an N-type region 82, when forming an PNP transistor 6. For example, in some embodiments N-type base region 82, having a phosphorus concentration of between $1 \times 10^{13}$ to $5 \times 10^{14}$ ions/cm$^2$, is formed using a phosphorus ion implant 80 having an energy between 50 to 100 KeV. Whereas, in embodiments having NPN transistor 6, P-type base region 82, having a boron concentration of between $1 \times 10^{13}$ to $5 \times 10^{14}$ ions/cm$^2$, is formed using boron ion implant 80 having an energy between 20 to 60 KeV. One of ordinary skill in the art will realize that an appropriate base region 82 is formed underlying an appropriate portion of structure 45, in significant part, due to the sub-micron nature of width 46.

Figure 4E:
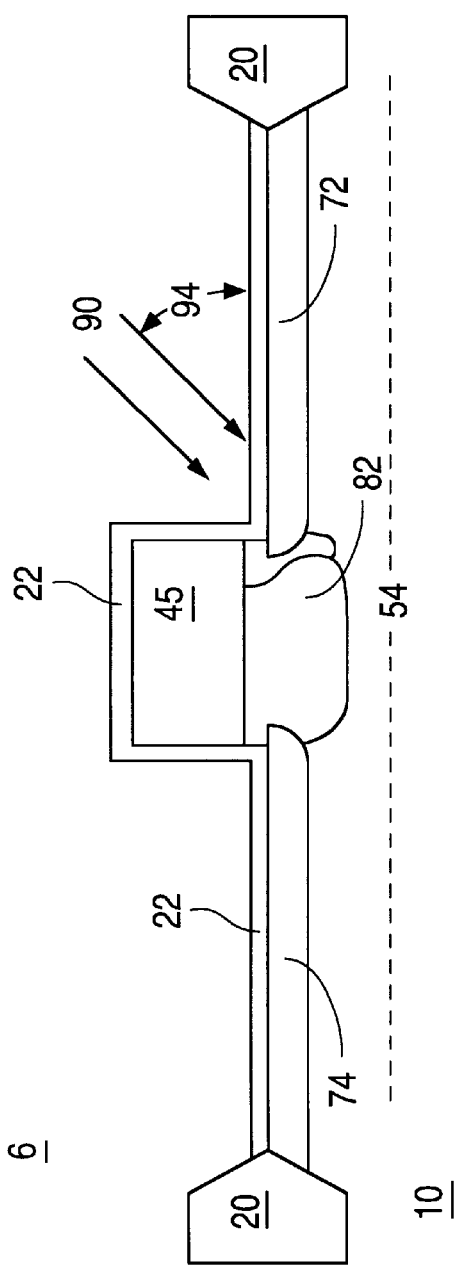

Turning now to FIG. 4E, the structure of FIG. 4D is shown after formation of collector region 92 by ion implant 90 and oxide layer 22. In embodiments of the present invention where base region 82 is formed without rotation of substrate 10, as previously described, region 82 is only proximate edge 48. Thus, implant 90 is an optional step as collector region 92 can be alternatively formed by diffusion of dopant from region 72, if present, and/or by diffusion of dopant from subsequently formed region 78 (FIG. 4G). In embodiments of the present invention where base region 82 is formed using substrate rotation during implant 84, implant 90 is not optional. Rather, implant 90 is required to provide adequate dopant for collector region 92. Where optional implant 90 is employed, implant 90 is performed at a second oblique angle 94 in the range of 45 to 75 degrees to substrate 10 without substrate rotation during implantation. In this manner, collector region 92 is formed adjacent edge 48. Thus, where transistor 6 is an NPN transistor and a phosphorus implant 90 is used, an N-type collector region 92, having a phosphorus concentration of between $5 \times 10^{13}$ to $5 \times 10^{14}$ ions/cm$^2$, is formed where implant 90 has an energy between 50 to 100 KeV. On the other hand, where transistor 6 is a PNP transistor and a boron implant 90 is used, a P-type collector region 92, having a boron concentration of between $5 \times 10^{13}$ to $5 \times 10^{14}$ ions/cm$^2$, is formed using an implant 90 having an energy between 20 to 50 KeV. In addition, where ion implant 90 is employed, MOS regions (not shown) are masked, as was done for base implant 80, to prevent implantation therein. It should be realized that even where no substrate rotation is employed during base implant 84, implant 90 can be advantageously used to provide additional control of lateral base width and/or tailor the collector profile for specific applications.

Still referring to FIG. 4E, oxide layer 22 is typically formed by a thermal oxidation step. Where optional implant 90 is employed, oxide layer 22 is formed subsequent to implant 90. Oxide layer 22 is typically a thin layer of silicon oxide formed having a thickness in the range of approximately 10 to 30 nm. While any commonly employed thermal oxidation process can be employed to form oxide layer 22, typically, layer 22 is formed concurrent with a MOS gate reoxidation step. The thermal oxidation used to form layer 22, advantageously serves to anneal and redistribute dopant from implants 70, 80 and, where employed, optional implant 90.

Figure 4F:
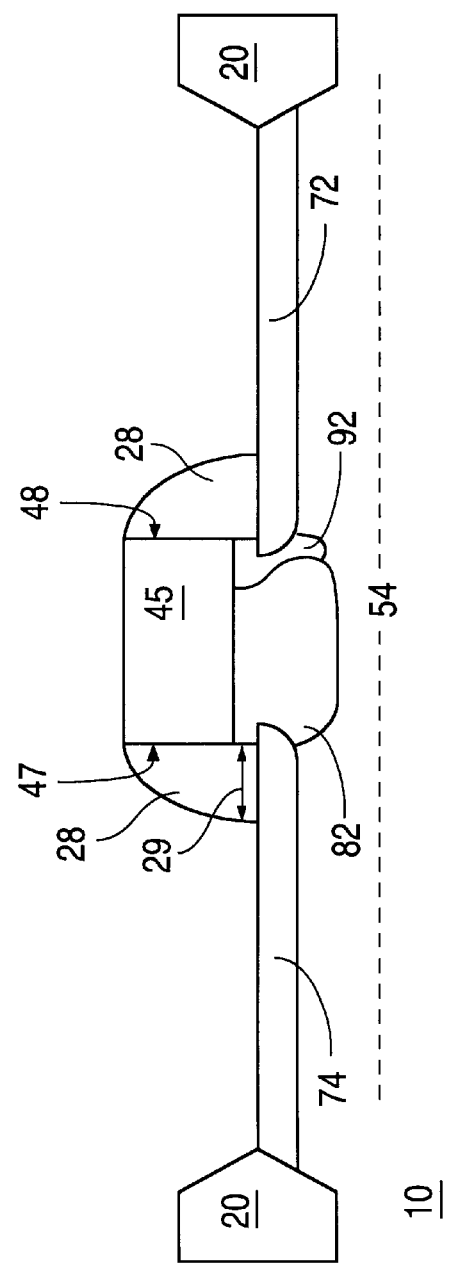
Figure 4G:
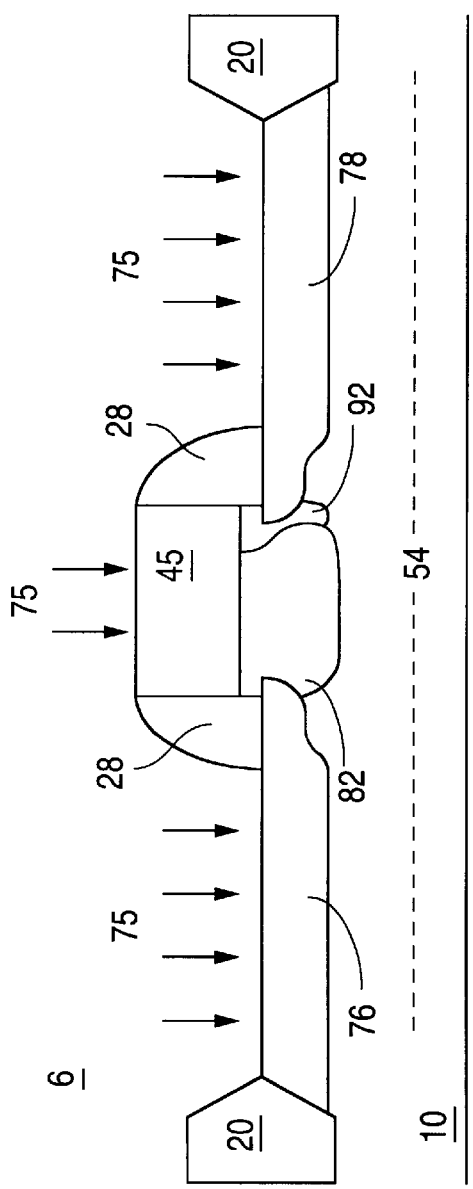

FIG. 4F shows the structure of FIG. 4E after the formation of spacers 28 adjacent edges 47 and 48 of base structure 45. Spacers 28 are typically formed from a blanket layer (not shown) of silicon oxide or silicon oxynitride material deposited using Chemical Vapor Deposition (CVD) or plasma Enhanced CVD (PECVD) techniques. This blanket layer is then etched with an anisotropic etch process, typically a reactive ion etch (RIE), to leave spacers 28, as is known. The specific thickness of the blanket layer desired, and hence width 29 of spacers 28, is in part, a function of width 46 (FIG. 4D) and is typically in the range of approximately 10 to 30 nm. The formation of spacers 28 is performed concurrent to the formation of spacers (not shown) adjacent MOS gate structures (not shown).

In FIG. 4G, implant 75 is depicted forming doped regions 76 and 78, aligned to spacers 28 and isolation regions 20 within bipolar region 54. Doped regions 76 and 78 are typically formed having a dopant concentration of between approximately $1 \times 10^{19}$ and $1 \times 10^{20}$ ions/cc. As known, the specific dopant type employed by implant 75 will depend upon whether an NPN or PNP transistor is desired. Thus, implant 75 is an N-type dopant, such as As, where an NPN transistor is desired, and a P-type dopant, such as B, where a PNP transistor is desired. In addition to regions 76 and 78, implant 75 advantageously serves to form source and drain regions (not shown) within MOS region 58. Thus, doped regions 76 and 78 are formed concurrently with MOS source and drain regions.

Figure 4H:
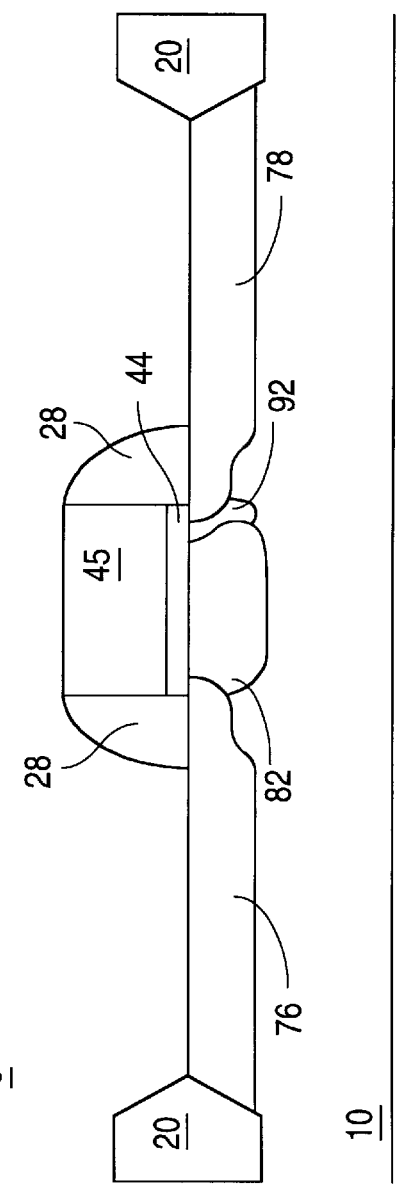

Referring now to FIG. 4H, lateral bipolar transistor 6 is shown after a thermal anneal/activation step has been performed. It will be understood that profiles of the various doped regions of lateral bipolar transistor 6 depicted by FIG. 4H, are only representative of the regions actually formed during the fabrication of transistors in accordance with embodiments of the present invention. Thus, while doped region or emitter 76 is depicted forming a junction with base region 82 underlying a specific portion of spacer 28, one of ordinary skill in the art will understand that the precise position of this junction will vary, depending upon implant angle 84, the dopant concentration of regions 76 and 82, the specific dopant ions used and the time and temperature of the thermal anneal process employed.

While formation of collector region 92 has been previously described using optional implant 90 (see FIG. 4E), in some embodiments optional implant 90 is not employed. Where implant 90 is not used, collector region 92 is formed, for example, by diffusion of dopant from other adjacent regions, e.g. from region 78, during a thermal anneal process.

FIG. 4H also shows the formation of doped region 44 within base contact structure 45. Region 44 is formed, in principle part, by the diffusion of dopant from base region 82 into contact structure 45. It will be understood, that formation of region 44 provides for a low resistance base contact.

As indicated, transistor 6 is compatible with a sub-micron CMOS flow, wherein base contact structure 45 is formed with gate electrode 40 (FIG. 4B) and emitter 76 and collector contact 78 are formed using implant 75 (FIG. 4G) which also forms the S/D regions of a CMOS transistor(not shown). In addition, one of ordinary skill in the art will realize that lateral transistor 6 is formed in a bipolar region 54 having essentially the same lateral dimension as CMOS region 58, and hence requires less surface area than transistors of the prior art, e.g. transistor 4 (FIG. 1).

Some embodiments of the present invention advantageously employ substrates other than those previously mentioned, e.g., with respect to FIGS. 2A and 3A. Thus, referring now to FIG. 5A, an embodiment depicting an SOI substrate 12 is seen at a fabrication stage equivalent to that of FIG. 2A. Substrate 12 is seen to encompass handle wafer 14, oxide layer 15 and silicon device layer 16. Typically both device layer 16 and oxide layer 15 are formed having a thickness of between approximately 100 to 500 nm, although other appropriate thicknesses can be used. Bipolar and MOS device regions 54 and 58 are depicted as being defined by LOCOS isolation regions 20, although other appropriate isolation techniques can be employed, e.g. trench isolation. As discussed with respect to FIG. 2A, a nitridization step is performed by first depositing and patterning masking layer 50 to expose upper surface 55 of region 54 and subsequently treating that exposed surface 55 with either a low energy $N_2$ plasma or $N_2$ implantation 60. In this manner, exposed surface 55 is made resistant to thermal oxidation. It will be understood, that the alternative nitridization embodiments, discussed with respect to FIGS. 3A and 3B, can be employed with embodiments having an SOI substrate 12, e.g., the embodiment of FIG. 5A, to provide exposed surface 55 of region 54 with resistance to oxidation.

Turning now to FIG. 5B, the structure of FIG. 5A is shown at a stage equivalent to that of FIG. 4H, where steps equivalent to those discussed with respect to FIGS. 4A to 4H have been performed to create lateral NPN transistor 8. As known, the process steps described previously for the bulk silicon substance embodiment can be used for an SOI substrate. Thus, isolation regions 20, emitter region 76, collector contact regions 78, base region 82 and collector region 92 are all formed in silicon device layer 16 and base contact structure 50 and spacer 28 formed overlying surface 55.

Figure 7A:
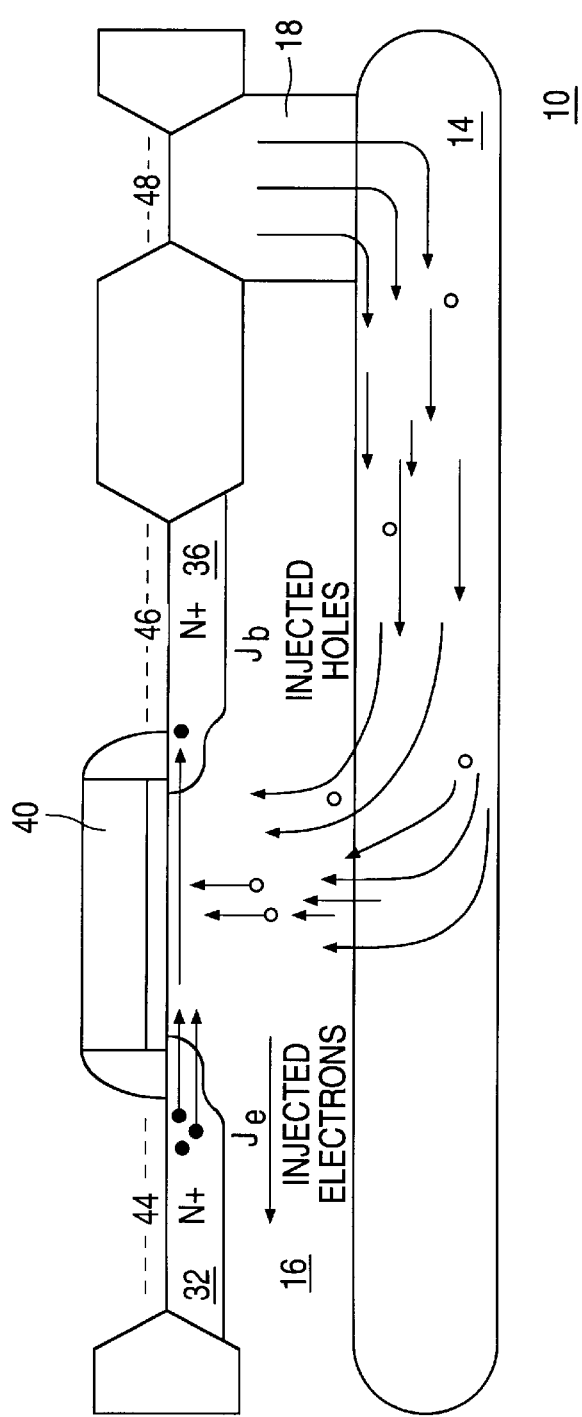
FIGS. 7A and 7B are cross-sectional views of NPN transistors 4 and 8, respectively, indicating paths for electron and hole transport.
Figure 7B:
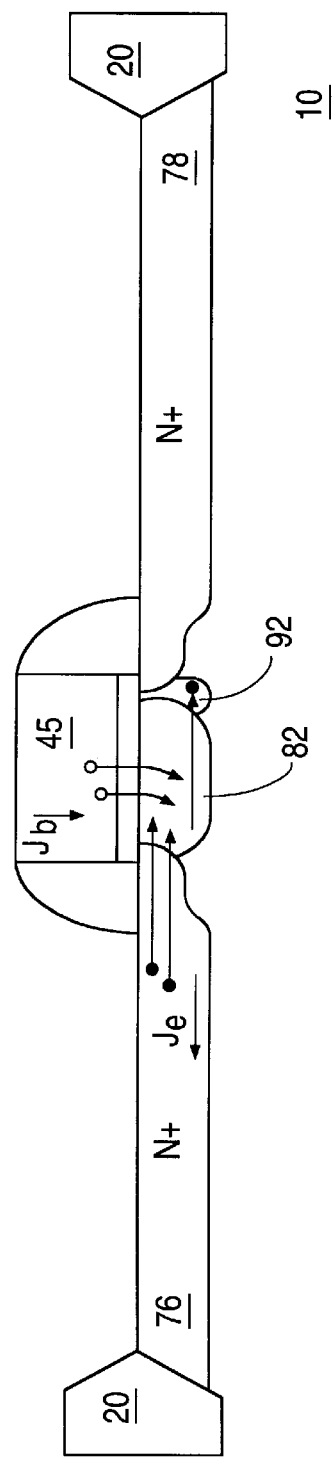

Both lateral bipolar transistors 6 (FIG. 4H) and 8 (FIG. 5B) offer enhanced performance as compared to prior art transistor 4 (FIG. 1) by virtue of their ismaller size and reduced base resistance. Turning to FIGS. 7A and 7B, the transistors of FIG. 1 and 5H, respectively, are shown having current paths indicated. As indicated, for NPN transistor 4 (FIG. 7A), holes are injected from region 18, through region 14 into region 16. In contrast, NPN transistor 8 (FIG. 7B) only requires injection of holes from region 45 into region 82. In addition, it can be seen that electron injection from region 32 of transistor 4 into region 16 and through to region 36, has a significantly longer path that for transistor 8. Thus, one of ordinary skill will realize that embodiments of the present invention will have enhanced electron and hole transport characteristics and hence enhanced performance.

Figure 6:
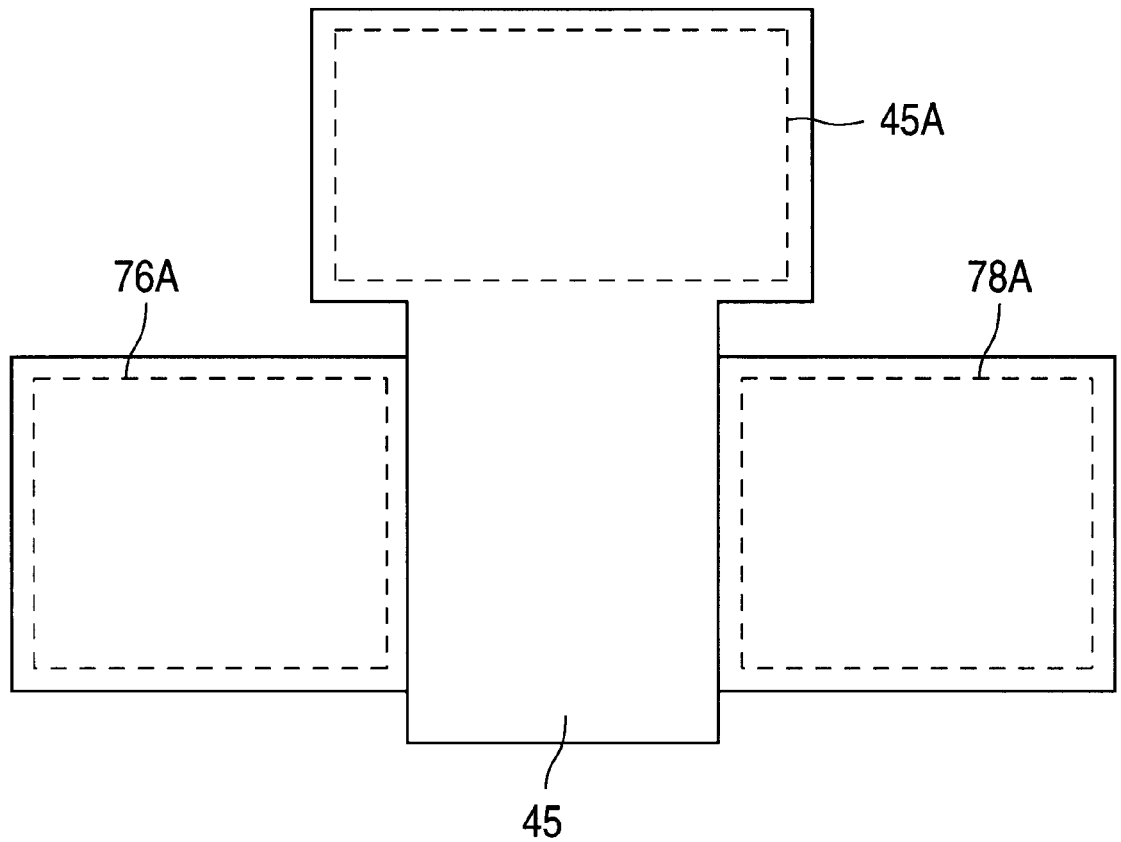
FIG. 6 is a plan view of the sub-micron lateral NPN transistors of FIGS. 4H or 5B.

FIG. 6 is a plan view of the sub-micron lateral NPN transistors 6 and 8 of FIGS. 4H or 5B, respectively. Emitter contact opening 76A and collector contact opening 78A are shown adjacent base structure 45. In some embodiments, contact openings 76A and 78A are coincident with exposed portions of regions 76 and 78 as defined by isolation regions 20 and spacers 28 (see, FIGS. 4H or 5B). In other embodiments a contact masking layer is formed and openings 76A and 78A formed therein. In addition, in some embodiments a metal silicide (not shown) is formed in contact regions 76A and 78A. Where utilized, the metal silicide regions are formed through a salicide process or a masked silicide process as is known.

As depicted, base contact structure 45 extends out from in-between regions 76A and 76B to allow the formation of a base contact opening 45A overlying base extension 45B, to allow for a dimension of opening 45A sufficient for a low resistance metallic contact. While the extension of base region 45 is typical, in some embodiments, a sufficient dimension for opening 45A can be provided by forming extended emitter and collector contact regions (not shown).

Thus, embodiments of the present invention have been described that show lateral bipolar transistors having increased performance and methods for forming thereof. For example, while a Prior Art transistor such as that of FIG. 7A has $F_T$ and $F_{MAX}$ in the range of 5 MHz to 50 Mhz, a transistor in accordance with embodiments of the present invention, such as that of FIG. 7B has $F_T$ and $F_{MAX}$ in the range of 1 GHz to 15 Ghz. In addition, the lateral bipolar transistors of the present invention have increased packing density over conventional lateral transistors and can advantageously be formed using either bulk semiconductor substrates or silicon on insulator (SOI) type substrates. Finally, it has been shown that the lateral bipolar transistors of the present invention, and the methods thereof, are easily integrated into sub-micron CMOS processing by using a standard CMOS process step to form a lateral bipolar transistor structure, as has been discussed. Thus, without a significant increase in process complexity or manufacturing costs, lateral bipolar transistors in accordance with the present invention are readily fabricated.

I claim:

1. A semiconductor integrated circuit, having a lateral bipolar transistor, comprising:

a bipolar active area having an upper surface;

a base contact structure, having a first sidewall and an opposing second sidewall, disposed overlying said bipolar active area, wherein said base contact structure is directly coupled to a portion of said upper surface and wherein said first sidewall and said second sidewall define a sidewall distance;

a base region underlying a first portion of said base contact structure wherein said base region is disposed adjacent said first sidewall and a width of said base region is less than said sidewall distance; and a collector region underlying a second portion of said base contact structure disposed adjacent said second sidewall and said base region.

2. The semiconductor integrated circuit of claim 1 wherein said base contact structure is less than or equal to 0.25 micron wide.

3. The semiconductor integrated circuit of claim 1 comprising a first dielectric spacer adjacent said first sidewall and a second dielectric spacer adjacent said opposing second sidewall.

4. The semiconductor integrated circuit of claim 1 comprising an emitter region disposed within said bipolar active area proximate said first sidewall.

5. The semiconductor integrated circuit of claim 1 comprising MOS transistors.

6. The semiconductor integrated circuit of claim 4 wherein said MOS transistors comprise both PMOS and NMOS transistors.

7. The semiconductor integrated circuit of claim 1 wherein said lateral bipolar transistor is a PNP transistor.

8. The semiconductor integrated circuit of claim 1 wherein said lateral bipolar transistor is an NPN transistor.

9. A semiconductor integrated circuit, having MOS transistors and a lateral bipolar transistor, comprising:

a bipolar active area having an upper surface;

a base contact structure disposed overlying said active area, said structure directly coupled to a portion of said upper surface and having a first sidewall and an opposing second sidewall;

a first dielectric spacer adjacent said first sidewall and a second dielectric spacer adjacent said second sidewall, wherein said spacers overlie portions of said upper surface and wherein said first sidewall and said second sidewall define a sidewall distance;

an emitter region disposed in said bipolar active area proximate said first sidewall;

a base region underlying a first portion of said base contact structure disposed adjacent said first sidewall and a width of said base region is less than said sidewall distance; and a collector region underlying a second portion of said base contact structure disposed adjacent said second sidewall and said base region.

10. The semiconductor integrated circuit of claim 9 wherein said lateral bipolar transistor is a PNP transistor.

11. The semiconductor integrated circuit of claim 9 wherein said lateral bipolar transistor is an NPN transistor.

12. The semiconductor integrated circuit of claim 9 wherein said MOS transistors comprise both NMOS and PMOS transistors.

13. A method of fabricating a lateral bipolar transistor compatible with deep sub-micron CMOS processing, comprising the steps of:

defining a bipolar active area having an upper surface within a semiconductor substrate;

forming a base contact structure essentially in direct contact with a portion of said upper surface, said contact structure having a first side and a second side;

forming a first dielectric spacer and a second dielectric spacer overlying portions of said active area, said first spacer adjacent said first side and said second spacer adjacent said second side, wherein said first side and said second side define a side distance;

forming an emitter region in said bipolar active area proximate said first side and said first spacer;

forming a base region, underlying said base contact structure, wherein a width of said base region is less than said side distance; and forming a collector region, underlying said base contact region, adjacent said second side and said base region.

14. The method of fabricating a lateral bipolar transistor of claim 13 wherein the step of forming a base region comprises forming a P-type base region.

15. The method of fabricating a lateral bipolar transistor of claim 13 wherein the step of forming a base region comprises forming a N-type base region.

16. The method of fabricating a lateral bipolar transistor of claim 13 comprising the step of forming said emitter region concurrently forms MOS source and drain regions.

* * * * *